(12) United States Patent
Ono et al.

(10) Patent No.: US 8,716,789 B2
(45) Date of Patent: May 6, 2014

(54) POWER SEMICONDUCTOR DEVICE

(75) Inventors: Syotaro Ono, Hyogo-ken (JP); Masaru Izumisawa, Hyogo-ken (JP); Hiroshi Ohta, Hyogo-ken (JP); Hiroaki Yamashita, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/610,532

(22) Filed: Sep. 11, 2012

(65) Prior Publication Data
US 2013/0248979 A1  Sep. 26, 2013

(30) Foreign Application Priority Data
Mar. 23, 2012  (JP) ................ 2012-066956

(51) Int. Cl.
*H01L 29/66* (2006.01)

(52) U.S. Cl.
USPC ........... 257/335; 257/337; 257/339; 257/340; 257/341

(58) Field of Classification Search
CPC ............ H01L 29/0615; H01L 29/1095; H01L 29/7802; H01L 29/7811; H01L 29/0692; H01L 29/78; H01L 29/7827; H01L 29/402
USPC .......................... 257/335, 337, 339, 340, 341
See application file for complete search history.

(56) References Cited

U.S. PATENT DOCUMENTS

| 6,849,880 | B1 | 2/2005 | Saito et al. | |
| 7,417,284 | B2 | 8/2008 | Yamauchi et al. | |
| 7,553,731 | B2 | 6/2009 | Yamauchi et al. | |
| 7,649,223 | B2 | 1/2010 | Kawashima | |
| 8,125,023 | B2 | 2/2012 | Ohta et al. | |
| 8,283,748 | B2 * | 10/2012 | Ren et al. | 257/506 |
| 2006/0124997 | A1 | 6/2006 | Yamauchi et al. | |
| 2006/0231917 | A1 * | 10/2006 | Ono et al. | 257/500 |
| 2007/0238271 | A1 | 10/2007 | Yamauchi et al. | |
| 2008/0001217 | A1 | 1/2008 | Kawashima | |
| 2008/0135926 | A1 | 6/2008 | Ono et al. | |
| 2010/0123186 | A1 * | 5/2010 | Ohta et al. | 257/329 |
| 2011/0018055 | A1 | 1/2011 | Ohta et al. | |
| 2011/0241172 | A1 * | 10/2011 | Kocon | 257/618 |
| 2012/0038023 | A1 * | 2/2012 | Ren et al. | 257/506 |
| 2012/0061721 | A1 * | 3/2012 | Kimura et al. | 257/133 |

FOREIGN PATENT DOCUMENTS

| JP | 2005-085990 | 3/2005 |
| JP | 2006-173202 | 6/2006 |
| JP | 2007-116190 | 5/2007 |
| JP | 2008-016518 | 1/2008 |
| JP | 2008-130775 | 6/2008 |
| JP | 2010-0123789 | 6/2010 |
| JP | 2011-029233 | 2/2011 |

* cited by examiner

*Primary Examiner* — Ngan Ngo
(74) *Attorney, Agent, or Firm* — Patterson & Sheridan, LLP

(57) ABSTRACT

A power semiconductor device according to an embodiment includes an element portion in which MOSFET elements are provided and a termination portion provided around the element portion, and has pillar layers provided respectively in parallel to each other in a semiconductor substrate. The device includes a first trench and a first insulation film. The first trench is provided between end portions of the pillar layers, in the semiconductor substrate at the termination portion exposed from a source electrode of the MOSFET elements. The first insulation film is provided on a side surface and a bottom surface of the first trench.

20 Claims, 15 Drawing Sheets

_(1)_

POWER SEMICONDUCTOR DEVICE

CROSS REFERENCE TO RELATED APPLICATIONS

This application is based upon and claims the benefit of priority from the prior Japanese Patent Application No. 2012-066956 filed in Japan on Mar. 23, 2012; the entire contents of which are incorporated herein by reference.

FIELD

Embodiments described herein relate generally to a power semiconductor device.

BACKGROUND

A MOSFET (Metal Oxide Semiconductor Field Effect Transistor) and an IGBT (Insulated Gate Bipolar Transistor) which are widely known as power semiconductor devices have a high-speed switching characteristic and a reverse blocking voltage (withstanding voltage) of a few dozens of volts to a few hundred volts. Power semiconductor devices of a MOSFET and an IGBT are widely used as power converters and controllers in home electric appliances, communication devices, and vehicle motors.

To achieve compactness, higher efficiency and lower power consumption of these power semiconductor devices, it is required to simultaneously achieve a high withstanding voltage and a low on resistance of the devices. As a configuration that simultaneously achieves a high withstanding voltage and a low on resistance, there is known a configuration in which a super-junction structure (hereinafter "SJ structure") that has alternately arranged p-type and n-type semiconductor layers (p-pillar layers and n-pillar layers) is provided on a drift layer of a power semiconductor device.

In general, an SJ structure is manufactured by a multiepitaxial process that performs ion implantation and an epitaxial growth process at plural times. As another process, there has been studied a method of forming an SJ structure by selectively forming plural trenches in parallel at approximately equal intervals on an epitaxial layer that becomes a drift layer of a power semiconductor device and by filling in these trenches with p-type epitaxial layers. According to this method, the devices can be manufactured at low cost because a number of processes can be decreased by the multiepitaxial process.

However, this method has a problem in that it is difficult to fill high-quality epitaxial layers into the trenches in a short time. When a growth speed of the epitaxial layers is made fast, opening portions of the trenches are closed before the trenches are filled in because a speed of epitaxial growth at shoulders of the trenches is faster than the speed in the trenches. As a result, portions (voids) that are not sufficiently filled with the p-type epitaxial layers are formed in the trenches, and impurity concentrations of the p-pillar layers and impurity concentrations of the n-pillar layers become non-uniform. Further, impurity concentrations of the p-pillar layers and impurity concentrations of the n-pillar layers also become non-uniform because of manufacturing variations when forming the p-pillar layers.

Particularly, when the above problem occurs at both end portions of the p-pillar layers and in the p-pillar layers arranged at outermost peripheral portions of the device, and when impurity concentrations at these portions become higher (become in a p-rich state) than in surrounding n-pillar layers, depletion layers are excessively extended to a side surface direction of the device, and densities of equipotential lines become high (an electric field concentration occurs) at a termination portion. As a result, a high electric field is applied to both end portions of the p-pillar layers, and to a boundary portion between the p-pillar layers arranged at the outermost peripheral portions of the device and the surrounding n-pillar layers. Consequently, reliability of the device decreases.

DETAILED DESCRIPTION

A power semiconductor device according to an embodiment includes an element portion in which power semiconductor elements are provided, and a termination portion that is provided around the element portion. The power semiconductor device includes a first-conductivity type semiconductor substrate, a second-conductivity type first impurity layer, a first-conductivity type second impurity layer, a gate electrode, a first electrode, a second electrode, a plurality of second-conductivity type pillar layers, a first trench, and a first insulation film. The first impurity layer is provided at a part of the element portion on an upper surface of the semiconductor substrate. The second impurity layer is provided at a part of an upper end of the first impurity layer. The gate electrode is provided to become in contact with the first impurity layer via a gate insulation film. The first electrode is provided on a lower surface of the semiconductor substrate.

The second electrode is provided to become in contact with at least the first impurity layer, on the upper surface of the semiconductor substrate. The plurality of pillar layers respectively have a band-shaped upper end exposed from an upper surface of the semiconductor substrate or a band-shaped upper end that is in contact with a lower end of the first impurity layer, and both first side ends and both second side ends that are connected to the upper end. The plurality of pillar layers are provided respectively in the semiconductor substrate beneath the second electrode and the semiconductor substrate at the termination portion exposed from the second electrode, and are arrayed in parallel with each other. The first trench is provided between portions that include the first ends of the pillar layers. The first trench is provided in the semiconductor substrate at the termination portion exposed from the second electrode. The first insulation film is provided on a side surface and a bottom surface of the first trench.

The power semiconductor device according to the embodiment is explained below with reference to the drawings. In the following explanation, a power MOSFET is taken up as an example of the power semiconductor device according to the embodiment.

Figure 1:
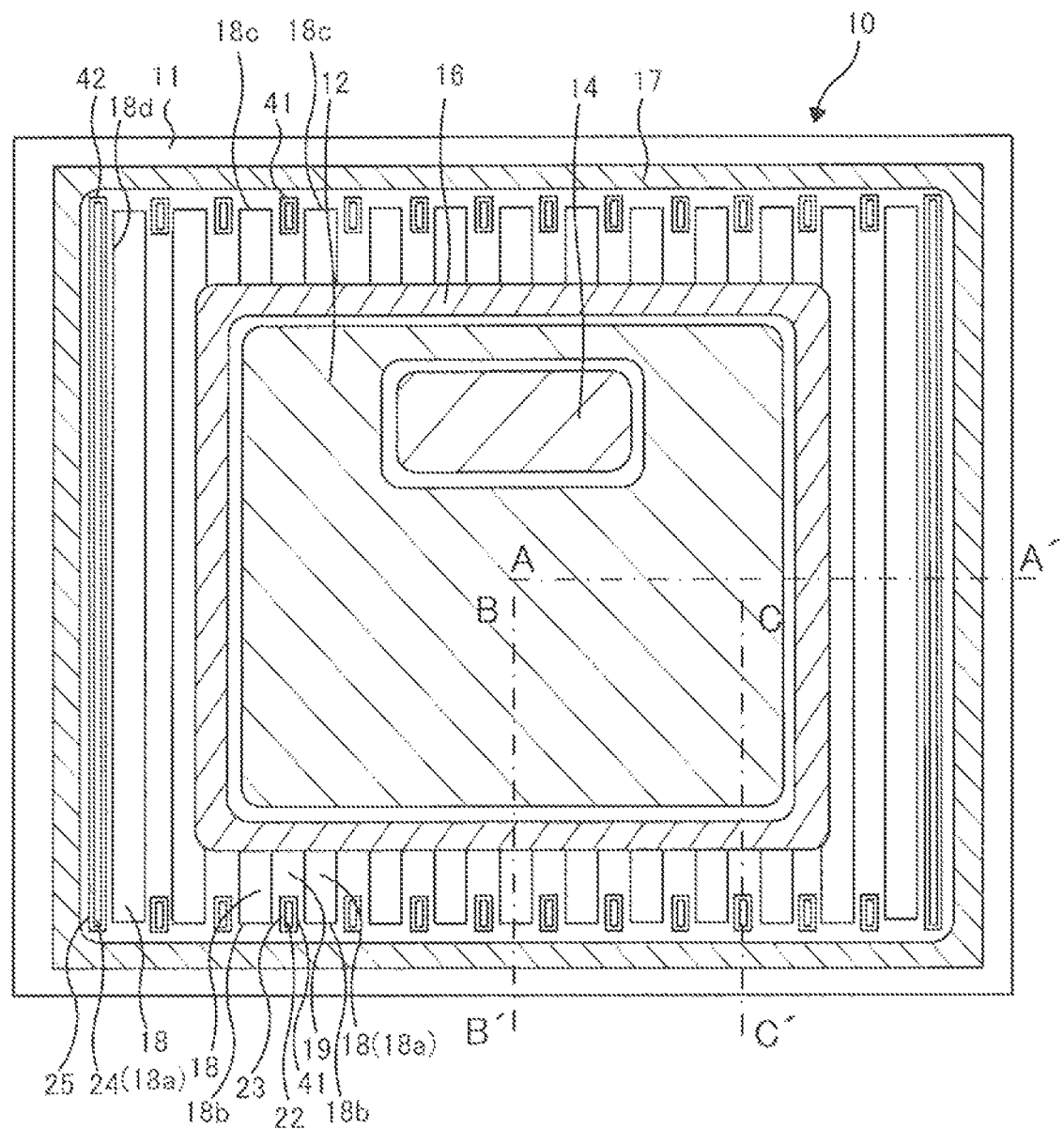
FIG. 1 is a plan view schematically showing a power semiconductor device according to an embodiment.
Figure 3:
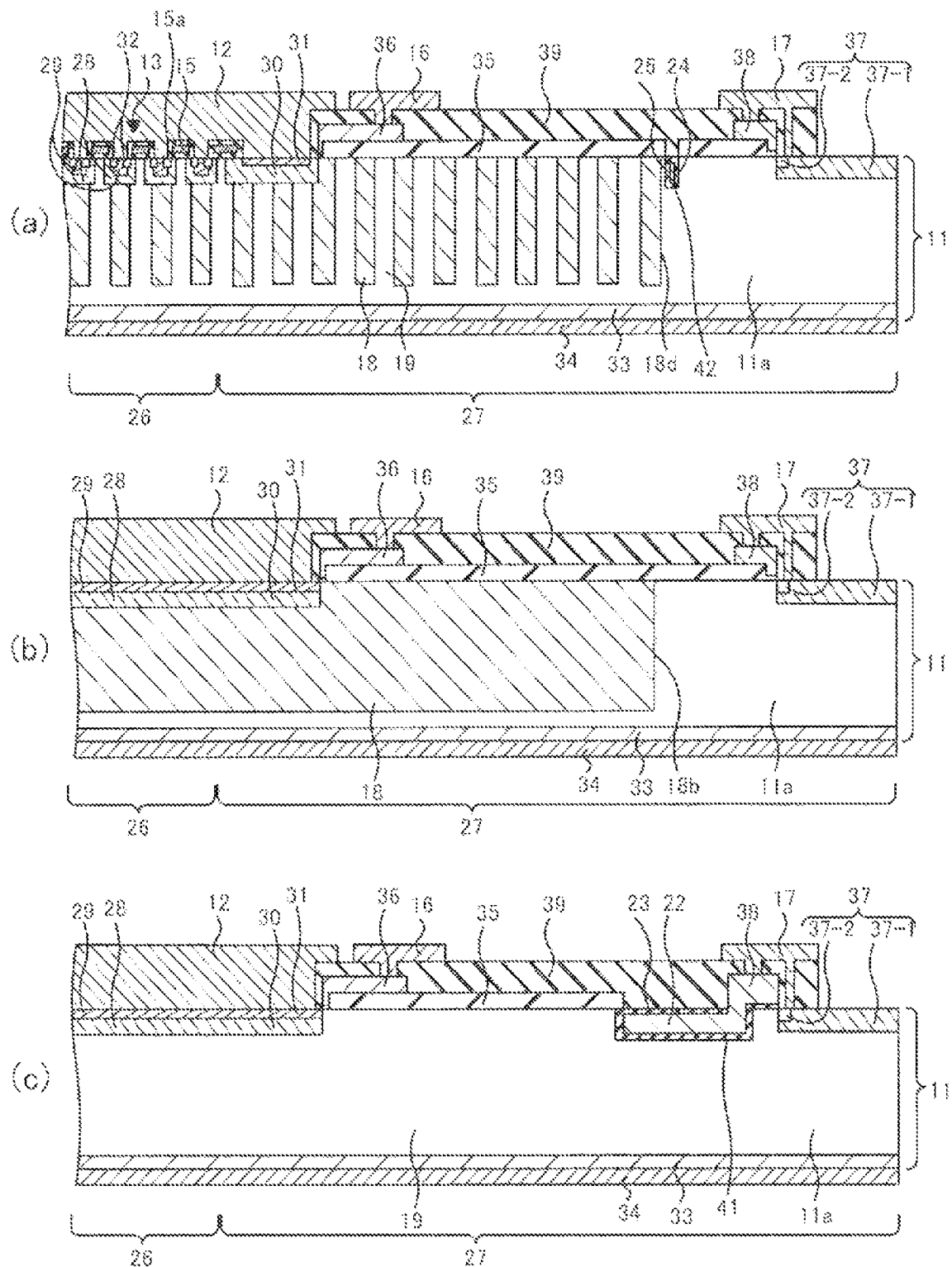
FIGS. 3A to 3C are cross-sectional views of the power semiconductor device according to the embodiment.

FIG. 1 is a plan view schematically showing a power semiconductor device 10 according to the embodiment. As shown in FIG. 1, a source electrode 12 of approximately a square shape in the plan view is provided at a center portion on a semiconductor substrate 11. Beneath the source electrode 12, plural MOSFET elements 13 (FIGS. 3A to 3C), for example, are arranged in parallel, as plural power semiconductor elements. The semiconductor substrate 11 is obtained by epitaxially growing a silicon layer on a silicon substrate, for example.

An opening region of approximately a square shape is provided at a part of the source electrode 12. In the opening region, a gate pad 14 is provided to be separated from the source electrode 12. The gate pad 14 is electrically connected to a gate electrode 15 (FIGS. 3A to 3C) of the respective MOSFET elements 13 arranged beneath the source electrode 12.

A ring-shaped field plate electrode pad 16 that surrounds the source electrode 12 is provided around the source electrode 12, on the semiconductor substrate 11. The ring-shaped field plate electrode pad 16 is provided such that an internal periphery of the ring-shaped field plate electrode pad 16 is slightly separated from an external periphery of the source electrode 12.

A ring-shaped EQPR (Equivalent Potential Ring) electrode pad 17 that surrounds the field plate electrode pad 16 is provided around the field plate electrode pad 16, on the semiconductor substrate 11. The ring-shaped EQPR electrode pad 17 is provided such that an internal periphery of the EQPR electrode pad 17 is separated from an external periphery of the field plate electrode pad 16 and is along an external peripheral portion of the device.

There are alternately arranged p-pillar layers and n-pillar layers 19 on the semiconductor substrate 11 beneath the source electrode 12, the semiconductor substrate 11 beneath the field plate electrode pad 16, and the semiconductor substrate 11 exposed from the field plate electrode pad 16, along a substrate surface.

Figure 2:
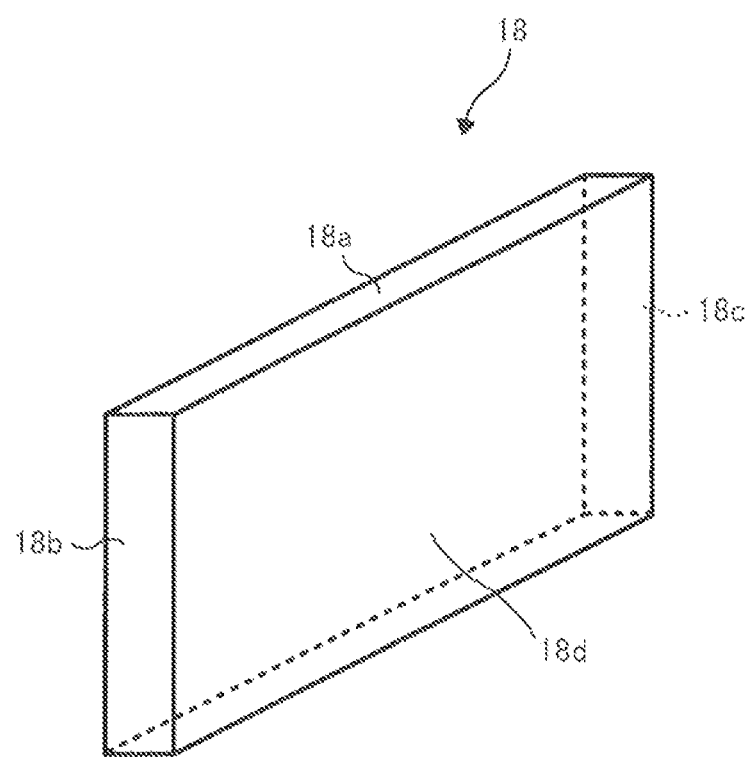
FIG. 2 is a perspective view of a p-pillar layer.

FIG. 2 is a perspective view of the p-pillar layer 18. As shown in FIG. 2, the p-pillar layer 18 has a band-shaped upper end 18a exposed from the semiconductor substrate 11, and both first side ends 18b, 18c and both second side ends 18d which are connected to the upper end 18a and are also perpendicular to the upper end 18a.

In the following explanation, a termination portion that includes the first side end 18b of the p-pillar layer 18 is called one end portion, and a termination portion that includes the first side end 18c of the p-pillar layer 18 is called the other end portion.

FIG. 1 is referenced again. Plural p-pillar layers 18 are provided on the semiconductor substrate such that plural upper ends 18a are arrayed mutually at approximately equal intervals. Plural n-pillar layers 19 as the semiconductor substrate 11 (the n-type semiconductor layers 11a described later) between the p-pillar layers 18 are also provided such that plural upper ends are arrayed at approximately equal intervals that are approximately equal to the intervals between the p-pillar layers 18.

In the semiconductor substrate 11 that is exposed to the outside from the field plate electrode pad 16, first trenches 41 are provided respectively in the n-pillar layers 19 between the one end portions of the p-pillar layer 18 and in the n-pillar layer 19 between the other end portions of the p-pillar layer 18. Each first trench 41 is provided such that at least a part of the first trench 41 is arrayed in an inner side than the plane surface that passes the first side end 18b, 18c of the p-pillar layers 19 sandwiching the first trench 41.

On the semiconductor substrate 11 exposed to the outside from the field plate electrode pad 16, second trenches 42 are provided at a further outside of the p-pillar layers 18 arranged at the outermost of the device. The second trenches 42 are provided along the second side end 18d of the p-pillar layers 18 arranged at the outermost of the device.

A field buffer layer 22 as a first floating electrode and a first insulation film 23 that covers the field buffer layer 22 are provided in each first trench 41. Similarly, a field buffer layer 24 as a second floating electrode and a second insulation film 25 that covers the field buffer layer 24 are provided in each second trench 42. The field buffer layers 22, 24 are made of polysilicon, for example.

The first trench 41 can be filled in with the first insulation film 23, and the second trench 42 can be filled in with the second insulation film 25.

FIGS. 3A to 3C are cross-sectional views of the power semiconductor device 10 shown in FIG. 1. FIG. 3A is a cross-sectional view along a chain line A-A' in FIG. 1, FIG. 3B is a cross-sectional view along a chain line B-B' in FIG. 1, and FIG. 3C is a cross-sectional view along a chain line C-C' in FIG. 1.

As shown in FIGS. 3A, 3B and 3C, the power semiconductor device 10 is configured by an element portion 26 and a termination portion 27 that surrounds the element portion 26. In the element portion 26, the plural MOSFET elements 13 as plural power semiconductor elements are arrayed in parallel.

As shown in FIGS. 3A, 3B and 3C, the semiconductor substrate 11 is made of silicon, for example, and is an epitaxial substrate obtained by epitaxially growing n-type semiconductor layers 11a on an n+-type high-concentration semiconductor substrate 33.

As shown in FIG. 3A, plural p-type base layers 28 are provided as first impurity layers, on an upper surface of the semiconductor substrate 11 of the element portion 26. A p+-type contact layer 29 is provided in a band shape, on an upper end of each base layer 28.

A base layer 30 and a contact layer 31 are also provided on an upper surface of the semiconductor substrate 11 close to the element portion 26, at the termination portion 27.

As shown in FIGS. 3B and 3C, each base layer 28 and each contact layer 29 of the element portion 26 are provided in a band shape. The base layer 30 and the contact layer at the termination portion 27 are formed in a ring shape that surrounds the element portion 26. One end and the other end of each band-shaped base layer 28 of the element portion 26 are coupled to the base layer 30 at the termination portion 27, and one end and the other end of each band-shaped contact layer 31 of the element portion are coupled to the contact layer 31 at the termination portion 27.

As shown in FIG. 3A, a source layer 32 as an n+-type second impurity layer is provided at a boundary portion between the base layer 28 and the contact layer 29, on an upper end of each base layer 28 of the element portion 26. The source layer 32 is provided in a band shape along the base layer 28 and the contact layer 29.

Band-shaped gate electrodes 15 of which peripheries are covered by gate insulation films 15a are provided as control electrodes, between the base layers 28 of the element portion 26 and between the base layer 28 of the element portion 26 and the base layer 30 at the termination portion 27, on the upper surface of the semiconductor substrate 11. In the element portion 26, the gate electrodes 15 are provided having mutually predetermined intervals such that the source layer 32 and the contact layers 29, 31 are exposed from the upper surface of the semiconductor substrate 11.

A drain electrode 34 as a first electrode is provided to become in contact with the high-concentration semiconductor substrate 33, on a whole lower surface of the semiconductor substrate 11.

The source electrode 12 as a second electrode is provided to become in contact with the contact layers 29, 31 and also become in contact with the source layer 32 of the element portion 26, on the upper surface of the semiconductor substrate 11 that includes the gate electrodes 15.

On the semiconductor substrate 11 of the element portion 26 that has the plural MOSFET elements 13, and on the semiconductor substrate 11 at the termination portion 27 that is provided with the base layer 30 and the contact layer 31, the p-pillar layers 18 and the n-pillar layers 19 are alternately arrayed, as shown in FIG. 3A. Each pillar layer 18 is provided in the semiconductor substrate 11 such that the upper ends 18a of a band shape (FIG. 2) become in contact with lower ends of the base layers 28, 30.

The p-pillar layers 18 and the n-pillar layers 19 are formed to a region that is extended to a further outside of the base layer 30 and the contact layer 31, out of the element portion 26 and the termination portion 27. The p-pillar layers 18 provided in the region extended to the outside of the base layer 30 and the contact layer 31 are provided in the semiconductor substrate 11 such that the band-shaped upper ends 18a are exposed from an upper end of the semiconductor layers 11a.

By providing the p-pillar layers 18 and the n-pillar layers 19 in the semiconductor substrate 11, depletion layers can be easily extended to an outer peripheral direction of the device, because the p-pillar layers 18 and the n-pillar layers 19 are mutually depleted during an off time (that is, when a voltage is not applied to the gate electrodes 15). Like in the embodiment, by providing the p-pillar layers 18 and the n-pillar layers 19 in the region from the element portion 26 to approximately an intermediate position at the termination portion 27, the depletion layers can be more easily extended to an outer peripheral direction of the device. Therefore, the device can be set to have a high withstanding voltage. During an on period (when a voltage equal to or higher than a pinch-off voltage is applied to the gate electrodes 15), a current flows in the n-pillar layers 19. However, by setting the impurity concentration of the layers 19 in a high concentration (and also by setting the impurity concentration of the p-pillar layers 18 in a high concentration accordingly), the on resistance can be decreased.

As shown in FIGS. 3A, 3B and 3C, a field oxide film 35 is provided in a ring shape around the source electrode 12, on the upper surface of the semiconductor substrate 11 at the termination portion 27.

A field plate electrode 36 made of polysilicon, for example, is provided at an internal peripheral portion of the oxide film 35, on the field oxide film 35. The field plate electrode 36 is electrically connected to each gate electrode 15, and extends the depletion layers formed by the p-pillar layers 18 and the n-pillar layers 19 to an external peripheral direction of the device, when a voltage is applied to between the drain electrode 34 and the source electrode 12. That is, the field plate electrode 36 is provided to improve a withstanding voltage of the device.

A channel stop layer 37 is provided in a ring shape as a third impurity layer, at an external peripheral portion of the semiconductor substrate 11, on the upper surface of the semiconductor substrate 11 at the termination portion 27. The channel stop layer 37 is provided such a ring-shaped upper end exposed from the semiconductor substrate 11 covers the upper ends 18a of all the p-pillar layers 18.

The channel stop layer 37 includes a p-type channel stop layer 37-1, and an n+-type channel stop layer 37-2 provided at a part of an upper end of the p-type channel stop layer 37-1.

An EQPR electrode 38 made of polysilicon, for example, is formed at an external peripheral portion of the oxide film 35, on the field oxide film 35. The EQPR electrode 38 has a ring shape.

The EQPR electrode 38 is connected to the channel stop layer 37 via the EQPR electrode pad 17, and has substantially the same potential as that of the drain electrode 34.

The channel stop layer 37 and the EQPR electrode 38 can suppress the depletions layers from reaching a cross section of the device, and can suppress a leak current that occurs when the depletion layers reach the cross section of the device.

A third insulation film 39 is provided at a part on the field oxide film 35 including the field plate electrode 36 and the EQPR electrode 38 and on the channel stop layer 37, such that a part of the field plate electrode 36, a part of the EQPR electrode 38, and a part of the channel stop layer 37 are exposed respectively. The field plate electrode pad 16 shown in FIG. 1 is provided on the third insulation film 39 to become in contact with the field plate electrode 36. The EQPR electrode pad 17 shown in FIG. 1 is provided on the third insulation film 39 to become in contact with the EQPR electrode 38 and the channel stop layer 37.

In the power semiconductor device 10, each of the first trenches 41 shown in FIG. 1 is provided from an upper surface of the semiconductor layer 11a of the semiconductor substrate 11 to a desired depth toward a depth direction of the semiconductor substrate 11, as shown in FIG. 3C. Similarly, each of the second trenches 42 shown in FIG. 1 is provided from the upper surface of the semiconductor layer 11a of the semiconductor substrate 11 to a desired depth toward a depth direction of the semiconductor substrate 11, as shown in FIG. 3A.

Each first trench 41 is filled in with the first insulation film 23, on the side surfaces and the bottom surface of the first trench 41, and the field buffer layer 22 is provided to fill in the first trench 41 in which the first insulation film 23 is provided.

Similarly, each second trench 42 is filled in with the second insulation film 25, on the side surfaces and the bottom surface of the second trench 42, and the field buffer layer 24 is provided to fill in the second trench 42 in which the second insulation film 25 is provided.

Figure 4:
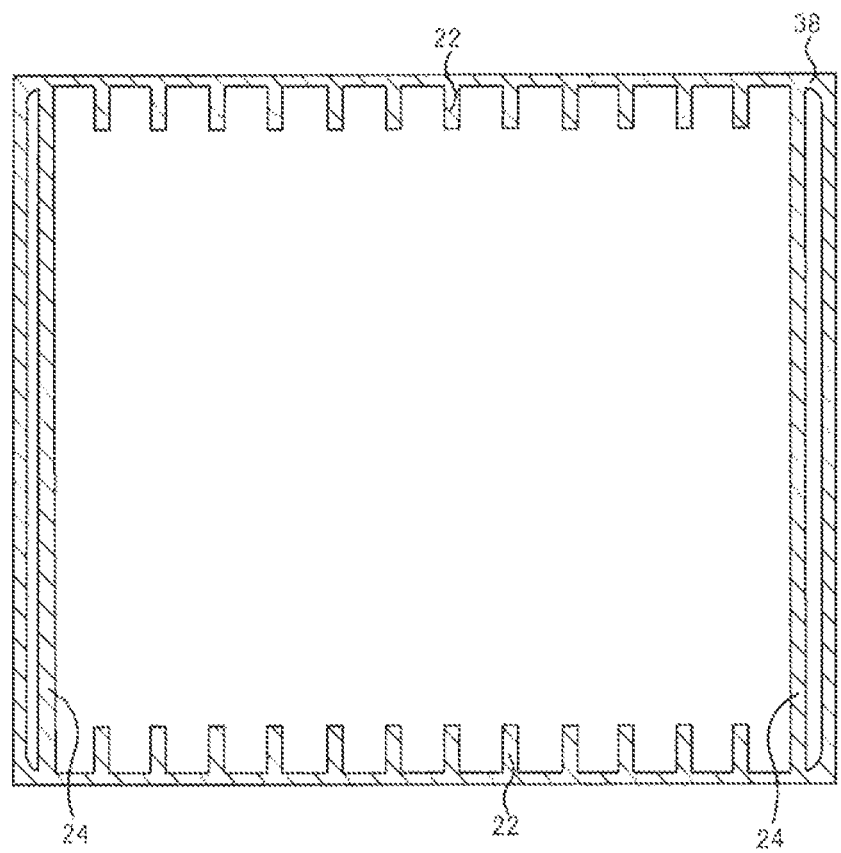
FIG. 4 is a plan view of field buffer layers and an EQPR electrode.
Figure 5:
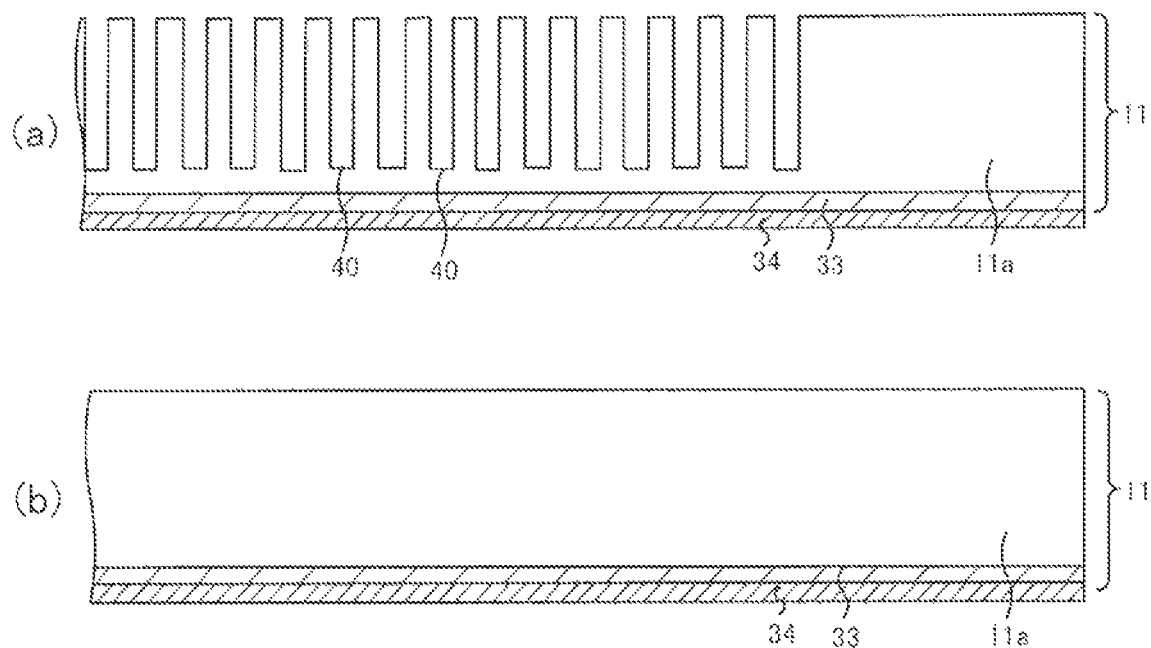
FIGS. 5A and 5B are cross-sectional views for explaining a method of manufacturing the power semiconductor device according to the embodiment.
Figure 6:
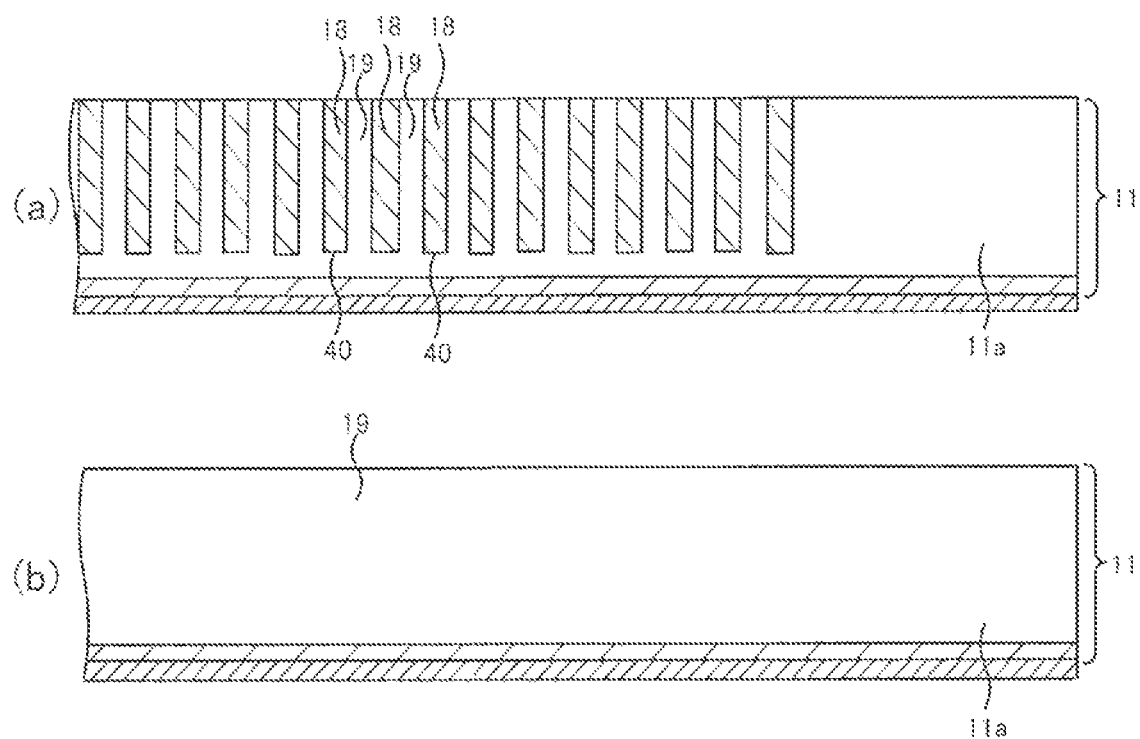
FIGS. 6A and 6B are cross-sectional views for explaining the method of manufacturing the power semiconductor device according to the embodiment.
Figure 7:
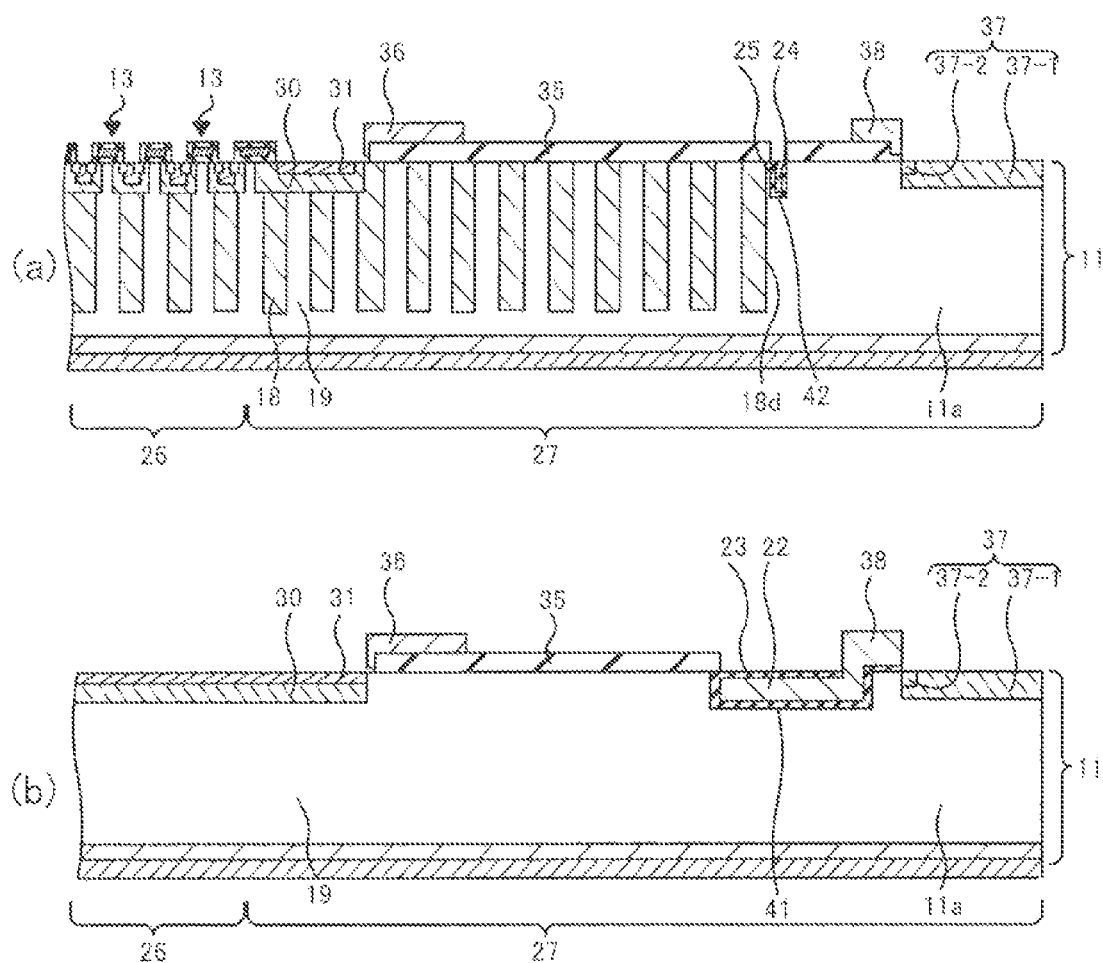
FIGS. 7A and 7B are cross-sectional views for explaining the method of manufacturing the power semiconductor device according to the embodiment.
Figure 8:
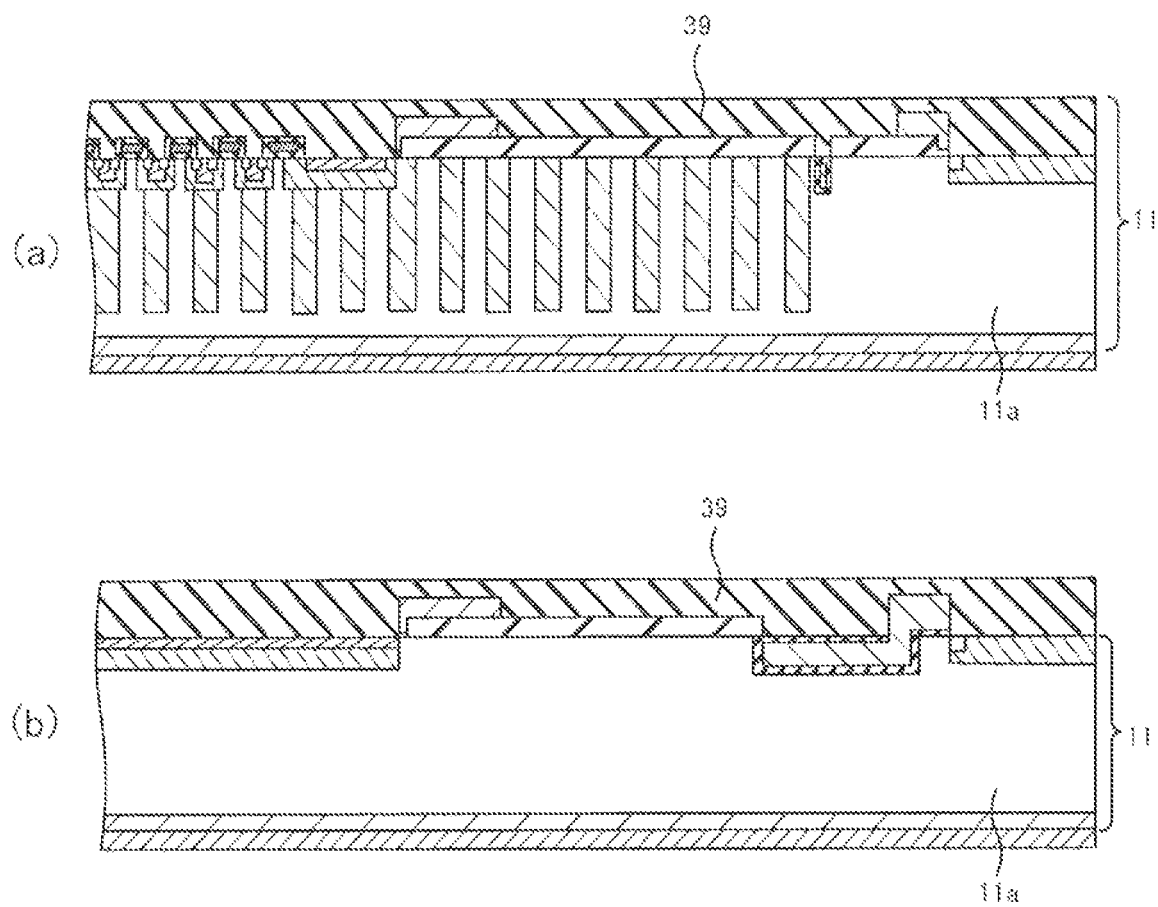
FIGS. 8A and 8B are cross-sectional views for explaining the method of manufacturing the power semiconductor device according to the embodiment.
Figure 9:
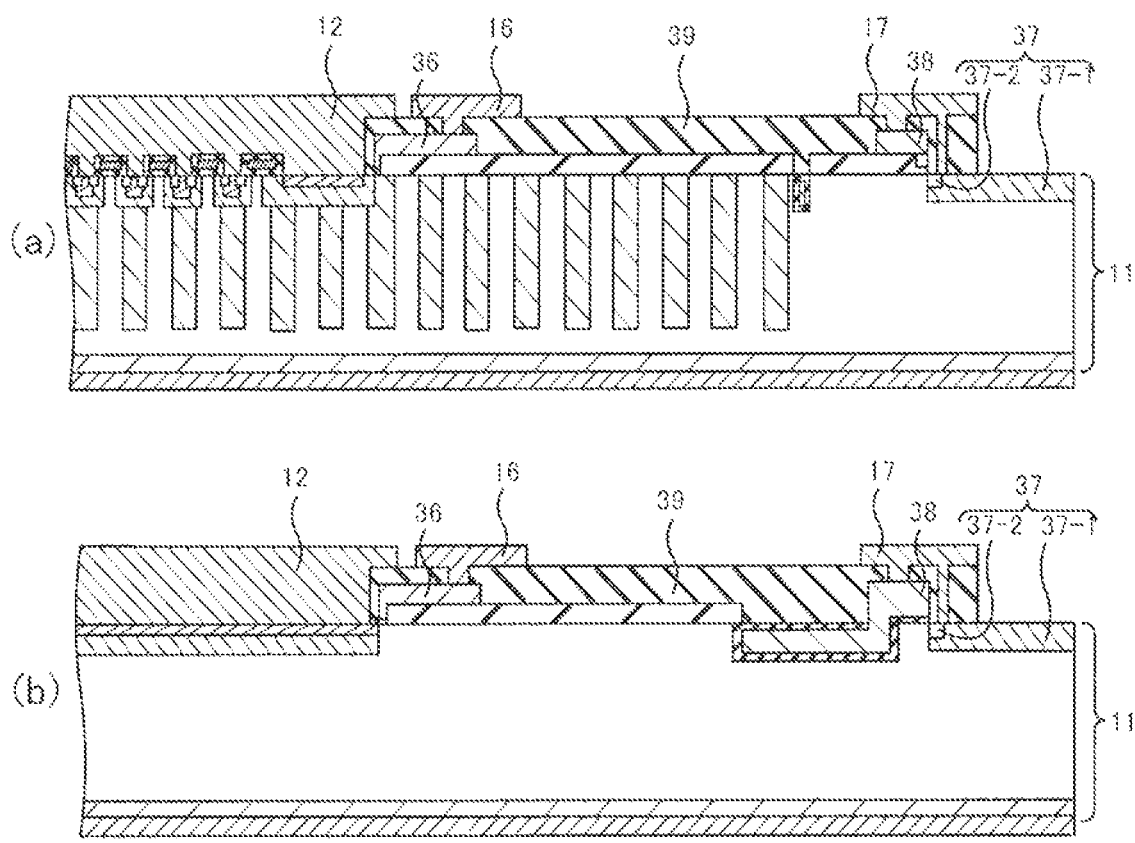
FIGS. 9A and 9B are cross-sectional views for explaining the method of manufacturing the power semiconductor device according to the embodiment.

The field buffer layers 22, 24 are explained in further detail with reference to FIG. 4. FIG. 4 is a plan view of the field buffer layers 22, 24 and the EQPR electrode 38. As shown in FIG. 4, the EQPR electrode 38 has approximately a square shape in a ring shape. Each field buffer layer 22 is provided to become in contact with one of opposite two sides of the ring-shaped EQPR electrode 38. The field buffer layer 24 is provided such that both ends become in contact with the opposite two sides of ring-shaped EQPR electrode 38.

The field buffer layers 22, 24 and the EQPR electrode 38 are provided such that the field buffer layers 22, 24 are arranged in the trenches 41, 42 provided in the semiconductor substrate 11, and that the EQPR electrode 38 is arranged on the field oxide film 35, as shown in FIGS. 3A and 3C.

The field buffer layers 22, 24 are provided to improve reliability of the device, by pushing back to a device internal direction the depletion layers that extend to the external peripheral direction of the device from the first side end 18b and the first side end 18c (FIG. 1) of each p-pillar layer 18, or by pushing back to a device internal direction the depletion layers that extend to the external peripheral direction of the device from the second side end 18d (FIG. 1) of the p-pillar layers 18 arranged at the outermost of the device. A detail is described later.

Next, a method of manufacturing the power semiconductor device 10 according to the embodiment is explained with reference to FIGS. 5A, 5B to FIGS. 9A, 9B. FIGS. 5A, 5B to FIGS. 9A, 9B are views for explaining the method of manufacturing the power semiconductor device 10 according to the embodiment. FIGS. 5A, 6A, 7A, 8A, 9A are cross-sectional views corresponding to FIG. 3A, and FIGS. 5C, 6C, 7C, 8C, 9C are cross-sectional views corresponding to FIG. 3C.

First, as shown in FIGS. 5A, 5B, the n-type semiconductor layer 11a is epitaxially grown on the n+-type high-concentration semiconductor substrate 33 made of polysilicon, for example, to form the semiconductor substrate 11 as an epitaxial substrate. The drain electrode 34 is then formed on a lower surface of the semiconductor substrate 11. Next, plural trenches 40 that are parallel with each other are formed in an upper surface of the semiconductor layer 11a toward a depth direction. Each trench 40 is formed by removing a region from the upper end of the semiconductor layer 11a of the semiconductor substrate 11 to a predetermined depth, by etching.

Next, as shown in FIGS. 6A, 6B, p-type semiconductor layers are epitaxially grown in the trenches 40 provided in the semiconductor substrate 11. Accordingly, plural p-pillar layers 18 are formed on the semiconductor substrate 11. The semiconductor substrate 11 between the p-pillar layers 18 becomes the n-pillar layer 19.

Next, as shown in FIGS. 7A, 7B, the plural MOSFET elements 13 are formed in regions that become the element portion 26, on the semiconductor substrate 11 on which the p-pillar layers 18 and the n-pillar layers 19 are provided. However, the source electrode 12 is not formed at this time point.

On the semiconductor substrate 11, the base layer 30 and the contact layer 31 are formed at apart of the region that becomes the termination portion 27, and the channel stop layer 37 is formed. The field oxide film 35 is formed on the upper surface of the semiconductor substrate 11 at the termination portion 27, and a predetermined region on the field oxide film 35 is removed by etching or the like. Thereafter, the upper surface of the semiconductor substrate 11 that is exposed by removal of the field oxide film 35 is etched to form the first and second trenches 41, 42.

Thereafter, the field plate electrode 36 and the EQPR electrode 38 made of polysilicon, for example, are formed on the field oxide film 35, the field buffer layers 22 covered by the first insulation films 23 are formed in the first trenches 41, and the field buffer layers 24 covered by the second insulation films 25 are formed in the second trenches 42.

Next, as shown in FIGS. 8A, 8B, the third insulation film 39 is formed on a whole surface of the semiconductor substrate 11.

Last, as shown in FIGS. 9A, 9B, the third insulation film 39 in the region in which the source electrode 12 is formed is removed, and the third insulation film 39 is removed to expose a part of the field plate electrode 36 and the EQPR electrode 38 and a part of the channel stop layer 37. Thereafter, the source electrode 12, the field plate electrode pad 16, and the EQPR electrode pad 17 are formed. As a result, manufacturing of the power semiconductor device 10 shown in FIG. 1 to FIGS. 3A to 3C is completed.

A reason for providing the field buffer layers 22 covered by the first insulation films 23 in the first trenches 41 and the field buffer layers 24 covered by the second insulation films 25 in the second trenches 42 in the power semiconductor device according to the embodiment is explained with reference to FIG. 10 to FIGS. 13A to 13C.

FIG. 10 and FIGS. 11A to 11C are views showing equipotential lines that are formed in a power semiconductor device (hereinafter, "power semiconductor device according to a comparative example") in which first and second trenches are not provided, field buffer layers covered by the first insulation films are not provided in the first trenches, and field buffer layers covered by the second insulation films are not provided in the second trenches.

In the power semiconductor device according to the comparative example shown in FIG. 10 and FIGS. 11A to 11C, impurity concentrations of p-pillar layers 18' are higher than an impurity concentration of an n-type semiconductor substrate around the p-pillar layers 18' because of a manufacturing variance and the like. That is, in the power semiconductor device according to the comparative example shown in FIG. 10 and FIGS. 11A to 11C, the p-pillar layers 18' are in a p-rich state.

The equipotential lines shown in FIG. 10 and FIGS. 11A to 11C show a state when a voltage of 500 V is applied to a drain electrode 34' and when a source electrode 12' is grounded in the power semiconductor device according the comparative example in which the p-pillar layers 18' are in a p-rich state.

Figure 10:
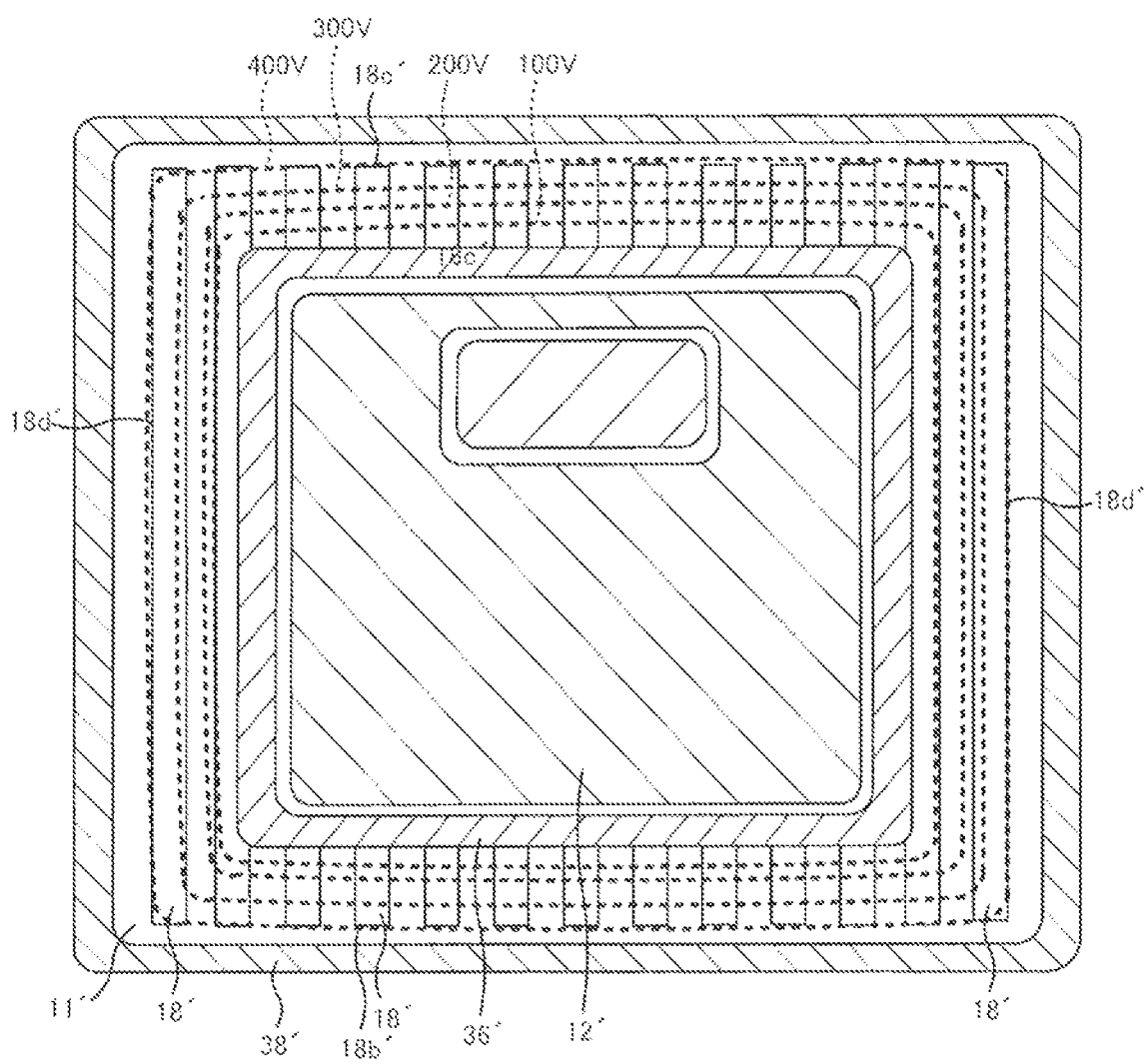
FIG. 10 is a plan view showing equipotential lines formed in a conventional power semiconductor device.
Figure 11:
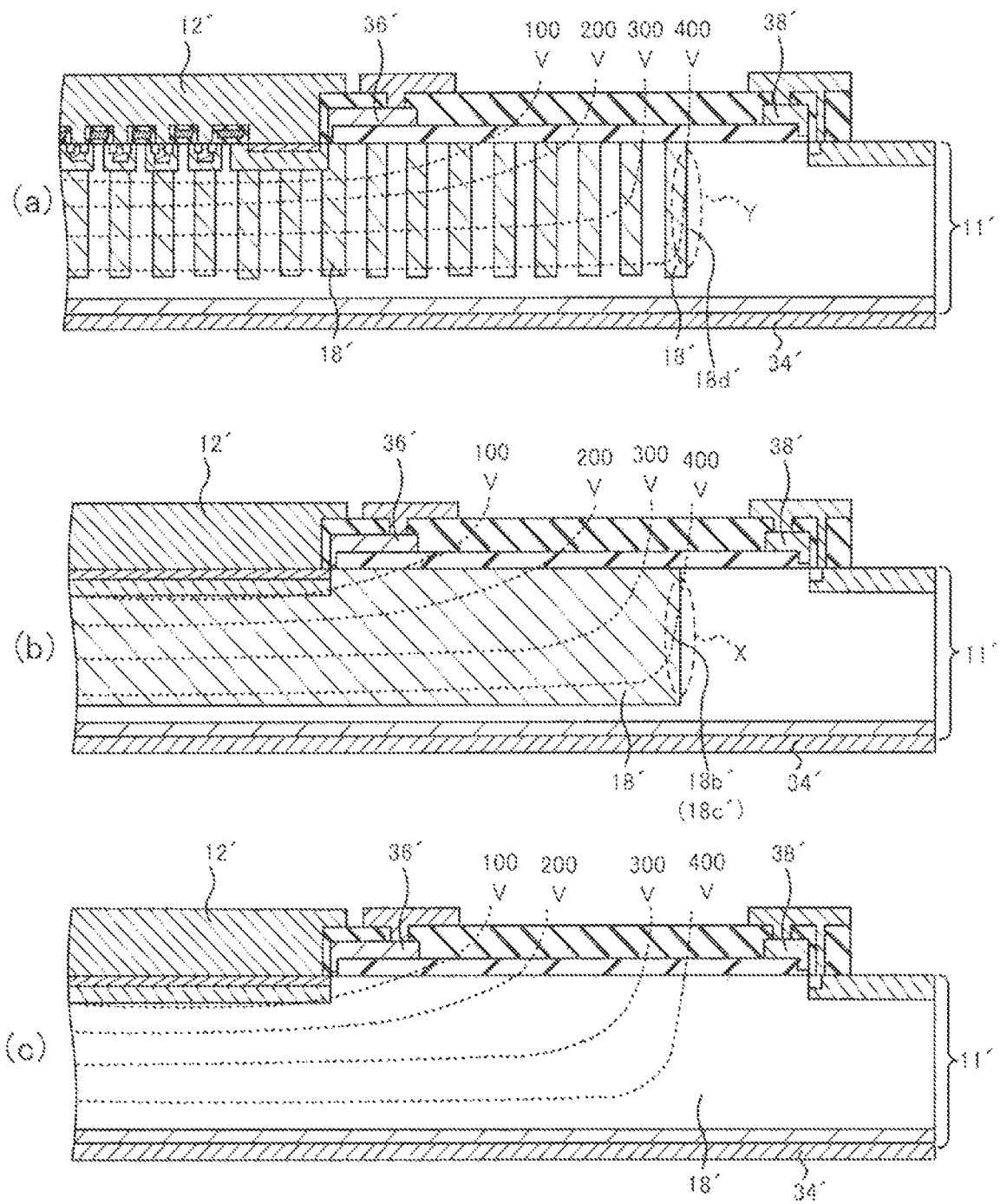
FIGS. 11A to 11C are cross-sectional views showing equipotential lines formed in a conventional power semiconductor device.

FIG. 10 is a view showing a state of equipotential lines of 100 V, 200 V, 300 V, and 400 V that are looked at from above the device, and FIGS. 11A to 11C are views showing a state of the equipotential lines of 100 V, 200 V, 300 V, and 400 V that are looked at from across section of the device. FIG. 11A shows the equipotential lines looked at from the cross section corresponding to FIG. 3A, FIG. 11B shows the equipotential lines looked at from the cross section corresponding to FIG. 3B, and FIG. 11C shows the equipotential lines looked at from the cross section corresponding to FIG. 3C.

As indicated by dotted lines in FIG. 10 and FIGS. 11A, 11B, 11C, the equipotential lines of 100 V, 200 V, 300 V, and 400 V are present to surround a field plate electrode 36' between the field plate electrode 36' and an EQPR electrode 38'. Particularly, the equipotential line of 400 V is present along the first side ends 18b', 18c' of each p-pillar layer 18', and the second side end 18d' of the p-pillar layers 18' arranged at the outermost of the device. A slightly external peripheral portion of the equipotential line of 400 V is at substantially 500 V as a drain voltage. Therefore, a potential difference of about 100 V is present and a high electric field is applied to both a region X (FIG. 11B) near a boundary between the first side end 18b' (the first side end 18c') of the p-pillar layer 18' and the semiconductor substrate 11' and a region Y (FIG. 11A) near a boundary between the second side end 18d' of the p-pillar layers 18' arranged at the outermost of the device and the semiconductor substrate 11'. Accordingly, what is called hot carriers occur because of avalanche breakdown, in the boundary region X and the boundary region Y. The generated hot carriers move following a potential difference between the drain electrode 34' and the source electrode 12'. Therefore, a leak current occurs, and reliability of the device decreases.

FIG. 12 and FIGS. 13A to 13C are views showing equipotential lines that are formed in the power semiconductor device according to the embodiment when the p-pillar layers 18 are in a p-rich state.

The equipotential lines shown in FIG. 12 and FIGS. 13A to 13C are equipotential lines when a voltage of 500 V is applied to the drain electrode 34 and when the source electrode 12 is grounded in the power semiconductor device according to the embodiment in which the p-pillar layers 18 are in the p-rich state.

Figure 12:
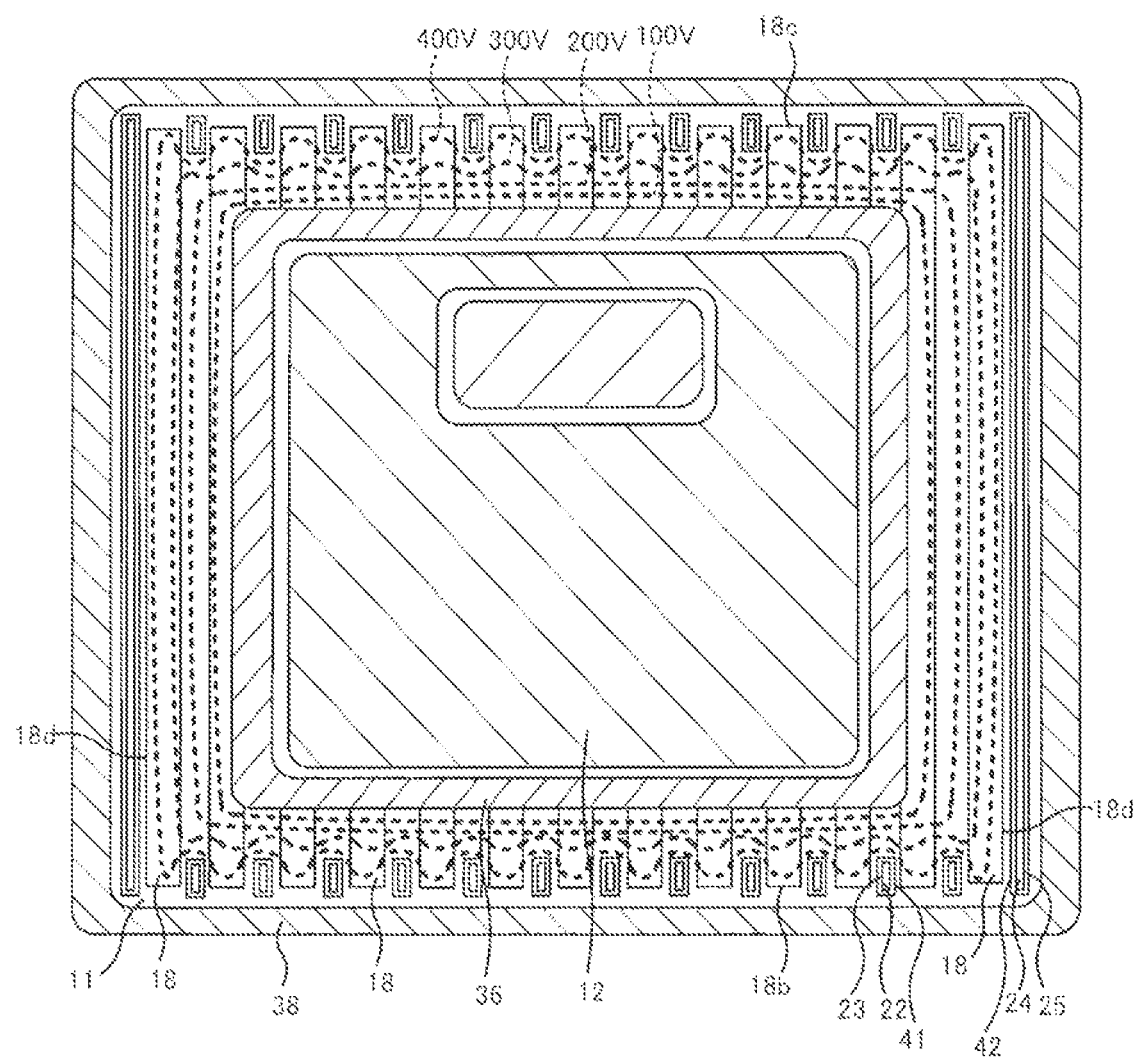
FIG. 12 is a plan view showing equipotential lines formed in the power semiconductor device according to the embodiment.
Figure 13:
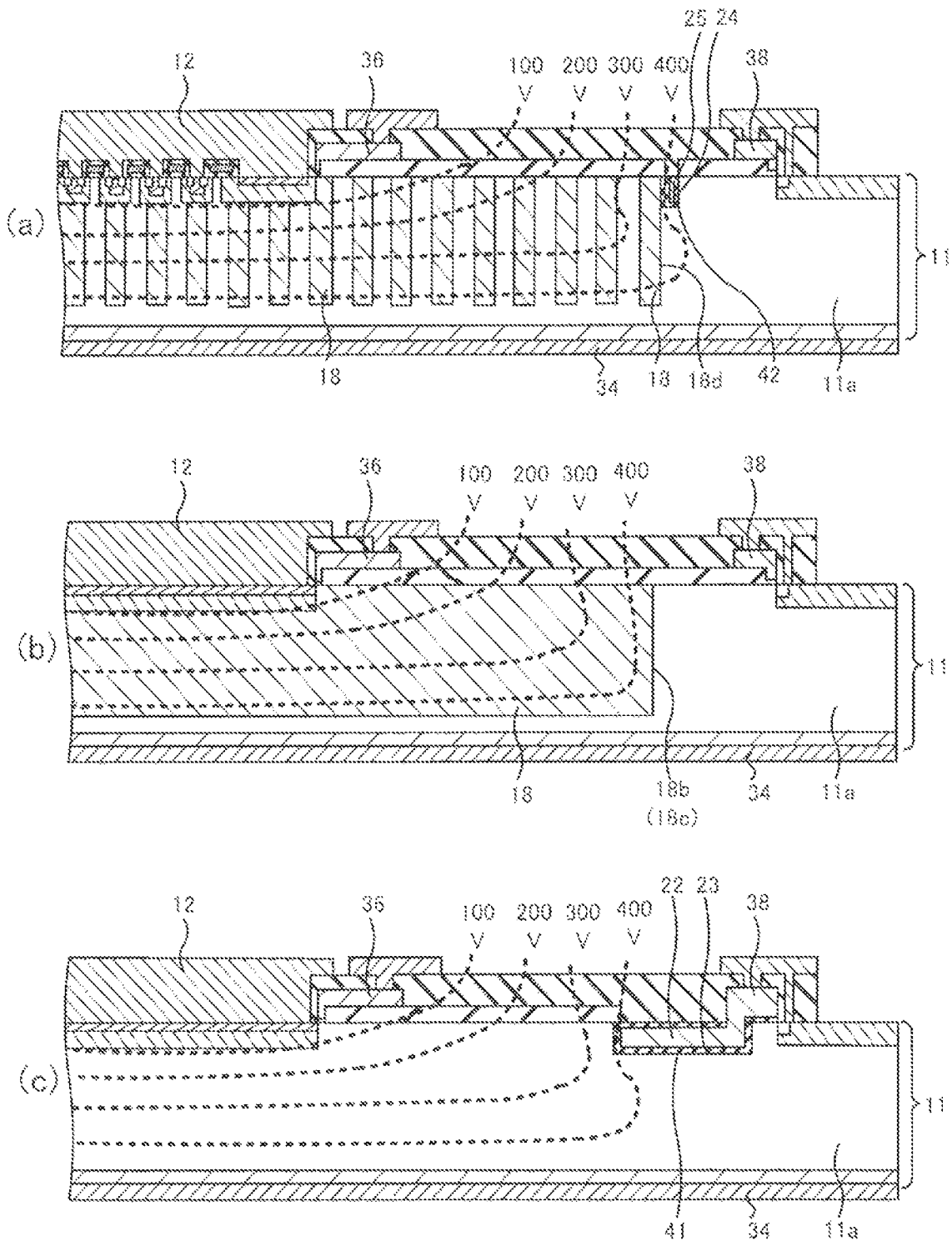
FIGS. 13A to 13C are cross-sectional views showing equipotential lines formed in the power semiconductor device according to the embodiment.

FIG. 12 is a view showing a state of equipotential lines of 100 V, 200 V, 300 V, and 400 V that are looked at from above the device, and FIGS. 13A to 13C are views showing a state of the equipotential lines of 100 V, 200 V, 300 V, and 400 V that are looked at from a cross section of the device. FIG. 13A shows the equipotential lines looked at from the cross section corresponding to FIG. 3A, FIG. 13B shows the equipotential lines looked at from the cross section corresponding to FIG. 3B, and FIG. 13C shows the equipotential lines looked at from the cross section corresponding to FIG. 3C.

As indicated by dotted lines in FIG. 12 and FIGS. 13A, 13B, 13C, the equipotential lines of 100 V, 200 V, 300 V, and 400 V are present to surround the field plate electrode 36 between the field plate electrode 36 and the EQPR electrode 38, in a similar manner to that in the power semiconductor device according to the comparative example. The field buffer layers 22 arranged between the one end portion and the other end portion of the p-pillar layers 18 are respectively connected to the EQPR electrode 38, and are at 500 V which is the same potential as that of the EQPR electrode 38. Therefore, the equipotential line of 400 V between the p-pillar layers 18 is pushed to the inner side of the device than the equipotential line of 400 V in the power semiconductor device according to the comparative example (FIG. 12 and FIG. 13C). Accordingly, the equipotential line of 400 V at the one end portion and the other end portion of the p-pillar layers 18 is also pushed to the inner side of the device than the equipotential line of 400 V in the power semiconductor device according to the comparative example (FIG. 12 and FIG. 13B).

The field buffer layers 24 arranged along the second side end 18d of the p-pillar layers 18 arranged at the outermost of the device also have a potential of 500 V which is the same as that of the EQPR electrode 38. Accordingly, the equipotential line of 400 V near the second side end 18d of the p-pillar layers 18 arranged at the outermost of the device is also pushed to the inner side of the device than the equipotential line of 400 V in the power semiconductor device according to the comparative example (FIG. 12 and FIG. 13A).

As a result, field strengths that are applied to both a boundary region between the first side end 18b, 18c of the p-pillar layers 18 and the surrounding n-type semiconductor substrate 11 and a boundary region between the second side end 18d of the p-pillar layers 18 arranged at the outermost of the device and the surrounding n-type semiconductor substrate 11 are buffered as compared with corresponding field strengths in the power semiconductor apparatus according to the comparative example. Therefore, occurrence of avalanche breakdown in these boundary regions can be suppressed. As a result, decrease of a leak current can be achieved, and reliability of the device improves.

As shown in FIG. 12 and FIGS. 13A, 13C, the equipotential line of 400 V passes the first insulation film 23 and the second insulation film 25. On the other hand, the field buffer layers 22, 24 are at approximately 500 V, respectively. Therefore, a potential difference of about 100 V is applied to the first insulation film 23 and the second insulation film 25. However, the first and second insulation films 23, 25 are not broken even when such a high voltage is applied, because the first and second insulation films 23, 25 are made of a material of a high withstanding-voltage ten or more times higher than that of silicon, for example.

As explained above, according to the power semiconductor device 10 in the embodiment, the first trenches 41 are provided between the one end portions and between the other end portions of the p-pillar layers 18, respectively. At the same time, the second trenches 42 are provided along the second side end 18d of the p-pillar layers 18 arranged at the outermost of the device. The field buffer layers 22 covered by the first insulation films 23 are provided in the first trenches 41, and the field buffer layers covered by the second insulation films 25 are provided in the second trenches 42. Therefore, the field strength in the boundary region between the p-pillar layer 18 and the semiconductor substrate 11 can be buffered, and reliability can be improved.

Figure 14:
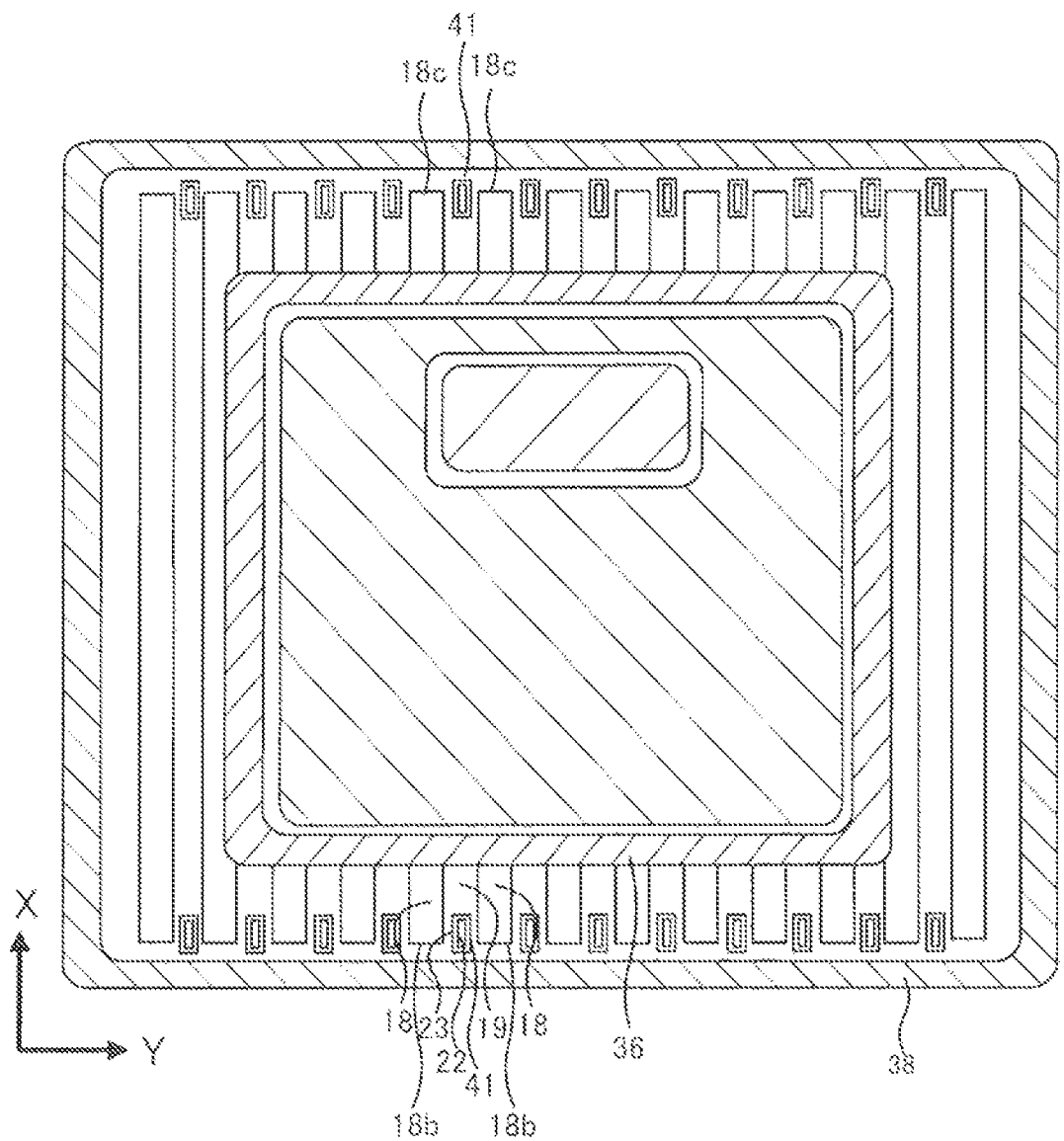
FIG. 14 is a simplified plan view of a power semiconductor device according to a first modification of the embodiment.

FIG. 14 is a simplified plan view of a power semiconductor device according to a first modification. As shown in FIG. 14, in the power semiconductor device according to the first modification, only the first trenches 41 internally having the field buffer layers 22 covered by the first insulation films 23 are provided between the one end portions and between the other end portions of the p-pillar layers 18, and the second trenches 42 internally having the field buffer layers 24 covered by the second insulation films 25 are excluded from the further outside of the p-pillar layers 18 arranged at the outermost of the device. The second trenches 42 and the like are excluded for the following reason. In the following explanation, a direction along a longitudinal direction of the p-pillar layers is called an X direction as shown in the drawing, and a direction perpendicular to the X direction is called a Y direction as shown in the drawing.

The p-pillar layers 18 provided in the element portion 26 are in contact with the base layer 28. Therefore, potentials of the p-pillar layers 18 of the element portion 26 become approximately equal to a potential of the source electrode 12. Accordingly, a potential difference between the drain electrode 34 and the source electrode 12 of 500 V, for example, is applied to a slight gap between the first side end 18b and the first side end 18c of the p-pillar layers 18 of the element portion 26 and the EQPR electrode 38 of which a potential is approximately equal to a potential of the drain electrode 34.

On the other hand, the p-pillar layers 18 arranged at the outermost of the device formed at the termination portion 27 are not in contact with the base layers 28, 30, and are therefore, in a floating state. Accordingly, the potential difference between the drain electrode 34 and the source electrode 12 of 500 V, for example, is applied to a gap between the field plate electrode 36 and the EQPR electrode 38 of which a potential is approximately equal to a potential of the drain electrode 34.

That is, a region to which the potential difference between the drain electrode 34 and the source electrode 12 of 500 V, for example, is applied has a larger area in the Y direction of the device than an area in the X direction of the device. Therefore, a field strength that is applied to between the p-pillar layers 18 arranged at the outermost of the device and the EQPR electrode 38 is weaker than a field strength that is applied to between the p-pillar layers 18 provided in the element portion 26 and the EQPR electrode 38. Accordingly, the second trenches 42 and the like provided in the region in which the field strength is relatively weak are not necessarily required to be provided.

Figure 15:
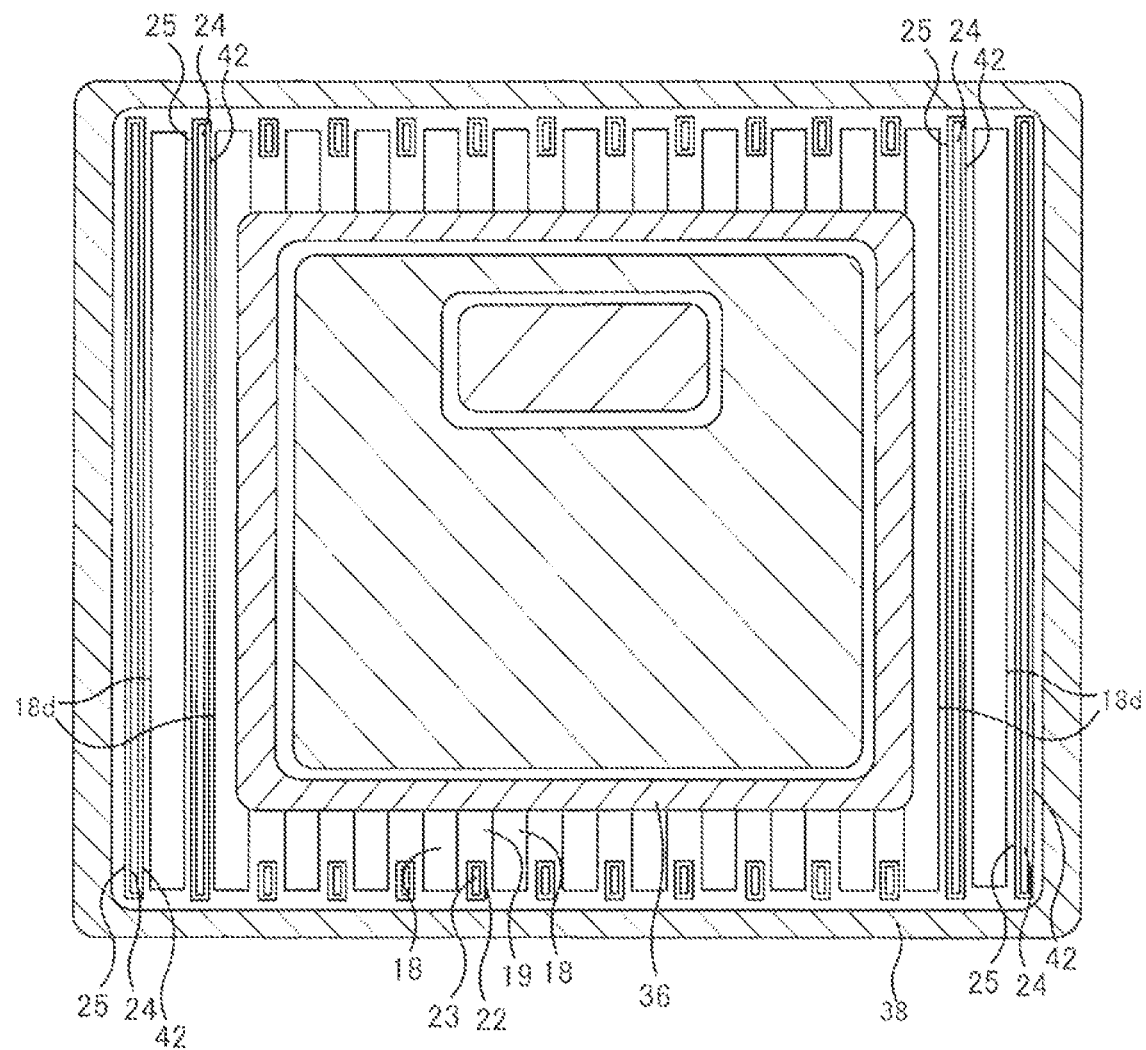
FIG. 15 is a simplified plan view of a power semiconductor device according to a second modification of the embodiment.

FIG. 15 is a simplified plan view of a power semiconductor device according to a second modification. As shown in FIG. 15, in the power semiconductor device according to the second modification, a configuration similar to that of the second trenches 42 internally having the field buffer layers 24 covered by the second insulation films 25 is also provided along the second side end 18d of the p-pillar layers 18, between the p-pillar layers 18 at the termination portion 27 at the outside of the field plate electrode 36. That is, the second trenches 42 internally having the field buffer layers 24 covered by the second insulation films 25 can be provided along the second side end 18d of the p-pillar layers 18, between the p-pillar layers 18 at the termination portion 27 at the outside of the field plate electrode 36.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, according to the embodiment, although the field plate electrode 36, the channel stop layer 37, and the EQPR electrode 38 are provided in the termination portion 27, other end structures such as a RESURF (reduced surface field) structure can be further provided in the termination portion 27.

Further, according to the embodiment, although the MOSFET element 13 is provided as a power semiconductor element in the element portion, an IGBT element, for example, can be formed in the element. Further, the MOSFET element and the IGBT element can be a planar type like in the embodiment, or a trench gate type.

What is claimed is:

1. A power semiconductor device including an element portion in which power semiconductor elements are provided, and a termination portion provided around the element portion, the power semiconductor device comprising:
    a first-conductivity type semiconductor substrate;
    a second-conductivity type first impurity layer provided at a part of the element portion on an upper surface of the semiconductor substrate;
    a first-conductivity type second impurity layer provided at a part of an upper end of the first impurity layer;
    a gate electrode provided to become in contact with the first impurity layer via a gate insulation film;
    a first electrode provided on a lower surface of the semiconductor substrate;
    a second electrode provided to become in contact with at least the first impurity layer, on the upper surface of the semiconductor substrate;
    a plurality of second-conductivity type pillar layers that have respectively a band-shaped upper end exposed from an upper surface of the semiconductor substrate or a band-shaped upper end that is in contact with a lower end of the first impurity layer, and both first side ends and both second side ends that are connected to the band-shaped upper end, the plurality of pillar layers provided in the semiconductor substrate beneath the second electrode and the semiconductor substrate at the termination portion exposed from the second electrode, and are arrayed in parallel with each other;
    a first trench provided between portion that includes the first side ends of the plurality of pillar layers, the first trench provided in the semiconductor substrate at the termination portion exposed from the second electrode; and
    a first insulation film provided on a side surface and a bottom surface of the first trench.

2. The power semiconductor device according to claim 1, further comprising:
    a third impurity layer of the first conductivity type in a higher concentration than that of the semiconductor substrate, provided on an upper surface of the semiconductor substrate so as to surround the upper ends of the plurality of pillar layers;
    an EQPR electrode that is provided on an upper surface of the semiconductor substrate so as to be connected to the third impurity layer; and
    a first floating electrode that is provided in the first trench in which the first insulation film is provided, and that is electrically connected to the EQPR electrode.

3. The power semiconductor device according to claim 2, wherein the EQPR electrode and the first floating electrode are made of polysilicon, respectively.

4. The power semiconductor device according to claim 3, wherein
    the EQPR electrode is made of polysilicon formed in approximately a square ring shape, and
    the first floating electrode is made of polysilicon provided so as to be in contact with one of opposite two sides of the ring-shaped EQPR electrode made of polysilicon.

5. The power semiconductor device according to claim 2, further having a field plate electrode provided between the second electrode and the EQPR electrode and connected to the gate electrode, above the upper surface of the semiconductor substrate.

6. The power semiconductor device according to claim 5, wherein
    the EQPR electrode and the field plate electrode are provided on a field oxide film provided on the upper surface of the semiconductor substrate.

7. The power semiconductor device according to claim 1, further comprising:
    a second trench provided along the second side end of the pillar layer, in the semiconductor substrate at the termination portion exposed from the second electrodes; and
    a second insulation film provided on a side surface and a bottom surface of the second trench.

8. The power semiconductor device according to claim 7, wherein
    the second trench is provided in the semiconductor substrate outside of the outermost pillar layer.

9. The power semiconductor device according to claim 8, further comprising:
    a third impurity layer of the first conductivity type in a higher concentration than that of the semiconductor substrate, provided on an upper surface of the semiconductor substrate so as to surround the upper ends of the plurality of pillar layers;
    an EQPR electrode provided to be connected to the third impurity layer;

a first floating electrode that is provided in first trench in which the first insulation film is provided, and that is electrically connected to the EQPR electrode; and a second floating electrode that is provided in second trench in which the second insulation film is provided, and that is electrically connected to the EQPR electrode.

10. The power semiconductor device according to claim 9, wherein the EQPR electrode, the first floating electrode, and the second floating electrode are made of polysilicon, respectively.

11. The power semiconductor device according to claim 10, wherein the EQPR electrode is a polysilicon formed in approximately a square ring shape, the first floating electrode is made of polysilicon provided so as to be in contact with one of opposite two sides of the ring-shaped EQPR electrode made of polysilicon, and the second floating electrode is made of polysilicon provided to be in contact with both two sides of the ring-shaped EQPR electrode made of polysilicon.

12. The power semiconductor device according to claim 9, further having a field plate electrode provided between the second electrode and the EQPR electrode and connected to the gate electrode, above the upper surface of the semiconductor substrate.

13. The power semiconductor device according to claim 12, wherein the EQPR electrode and the field plate electrode are provided on a field oxide film provided on the upper surface of the semiconductor substrate.

14. The power semiconductor device according to claim 7, wherein second trenches are provided in the semiconductor substrate outside of the outermost pillar layer, and in the semiconductor substrate between the outermost pillar layer and other pillar layer adjacent to the outermost pillar layer.

15. The power semiconductor device according to claim 14, further comprising:

a third impurity layer of the first conductivity type in a higher concentration than that of the semiconductor substrate, provided on an upper surface of the semiconductor substrate so as to surround the upper ends of the plurality of pillar layers;

an EQPR electrode provided to be connected onto the third impurity layer;

a first floating electrode that is provided in first trench in which the first insulation film is provided, and that is electrically connected to the EQPR electrode; and second floating electrodes that are provided in second trenches in which the second insulation films are provided, and that are electrically connected to the EQPR electrode, respectively.

16. The power semiconductor device according to claim 15, wherein the EQPR electrode, the first floating electrode, and the plurality of second floating electrodes are made of polysilicon.

17. The power semiconductor device according to claim 16, wherein the EQPR electrode is a polysilicon formed in approximately a square ring shape, the first floating electrode is made of polysilicon provided so as to be in contact with one of opposite two sides of the ring-shaped EOPR electrode made of polysilicon, and the second floating electrodes are made of polysilicon provided to be in contact with both two sides of the ring-shaped EQPR electrode made of polysilicon.

18. The power semiconductor device according to claim 15, further having a field plate electrode provided between the second electrode and the EQPR electrode and connected to the gate electrode, above the upper surface of the semiconductor substrate.

19. The power semiconductor device according to claim 18, wherein the EQPR electrode and the field plate electrode are provided on a field oxide film provided on the upper surface of the semiconductor substrate.

20. The power semiconductor device according to claim 1, wherein the power semiconductor element is a MOSFET element that has the first impurity layer as a base layer, the second impurity layer as a source layer, the first electrode as a drain electrode, and the second electrode as a source electrode.

* * * * *